United States Patent
Ngningha Junior et al.

(10) Patent No.: US 11,181,559 B2
(45) Date of Patent: Nov. 23, 2021

(54) ANALOG OUTPUT CURRENT TRANSMITTER

(71) Applicant: Aktiebolaget SKF

(72) Inventors: Gilles Ngningha Junior, Tours bat C (FR); Arnaud Pinon, Azay sur Cher (FR)

(73) Assignee: Aktiebolaget SKF, Gothenburg (SE)

( * ) Notice: Subject to any disclaimer, the term of this patent is extended or adjusted under 35 U.S.C. 154(b) by 40 days.

(21) Appl. No.: 16/718,770

(22) Filed: Dec. 18, 2019

(65) Prior Publication Data

US 2020/0200804 A1 Jun. 25, 2020

Related U.S. Application Data

(60) Provisional application No. 62/782,402, filed on Dec. 20, 2018.

(51) Int. Cl.
   *G01R 19/00* (2006.01)
(52) U.S. Cl.
   CPC .................. *G01R 19/0092* (2013.01)
(58) Field of Classification Search
   CPC . G01R 19/0092; F16C 2233/00; F16C 41/007
   See application file for complete search history.

(56) References Cited

U.S. PATENT DOCUMENTS

| | | | | |
|---|---|---|---|---|
| 4,441,061 A | * | 4/1984 | Yoshida | H02P 23/22 318/601 |
| 2010/0277142 A1 | * | 11/2010 | Tan | H02M 7/53803 323/268 |
| 2011/0075454 A1 | * | 3/2011 | Jones | H02M 3/22 363/67 |
| 2014/0084994 A1 | * | 3/2014 | Merkin | G05F 1/56 327/543 |
| 2018/0017981 A1 | * | 1/2018 | McFarland | G01R 19/02 |

* cited by examiner

*Primary Examiner* — Dominic E Hawkins
(74) *Attorney, Agent, or Firm* — Garcia-Zamor Intellectual Property Law; Ruy Garcia-Zamor; Bryan Peckjian

(57) ABSTRACT

An analog output current transmitter includes a first circuit portion that generates analog sine and cosine voltage signals, a second circuit portion that transforms the analog sine and cosine voltage signals into current signals, the signals being transformed by an operational transconductance amplifier, and a third circuit portion providing a current limiter, the current limiter circuitry limits the output current to a defined threshold. No microcontroller is required in order to monitor and regulate the output current to the defined threshold. Also a system and method for sensing shaft bearing shaft rotation over 360 mechanical degrees having an analog output current transmitter is provided.

14 Claims, 4 Drawing Sheets

ANALOG OUTPUT CURRENT TRANSMITTER

CROSS-REFERENCE TO RELATED APPLICATIONS

This application claims the benefit of Priority to U.S. Provisional Application 62/782,402, filed Dec. 20, 2018, the contents of which are hereby incorporated by reference in its entirety.

TECHNOLOGICAL FIELD

The present invention relates to the field of sensing bearing rotation over 360 Mechanical degrees. The invention relates more particularly to the field of sensing bearing rotation over 360 mechanical degrees with a system enabling an analog output current.

BACKGROUND OF THE INVENTION

Sensor bearing signals used to be, voltage signals in Pulse Width Modulation or analog sine & cosine voltages. However, it can be difficult for the signals to withstand long lengths of cables. That is because some Electrical Control Units (ECU) hardly manage voltage signals.

An alternative solution proposed by the instant invention is to use current signals instead of voltage. The valuable and uniqueness of this new development is in its ability to deliver accurate current signals without a microcontroller. Furthermore, long cable connections create noise for voltage output, along with loss of amplitude. With current output, the signals are less sensitive to noise or loss of amplitude.

SUMMARY OF THE INVENTION

According to a first aspect, an exemplary embodiment relates to an analog output current transmitter comprising; a first circuit portion that generates analog sine and cosine voltage signals, a second circuit portion that transforms the analog sine and cosine voltage signals into current signals, the signals being transformed by an operational transconductance amplifier, a third circuit portion providing a current limiter, the current limiter circuitry limits the output current to a defined threshold, wherein no microcontroller is required in order to monitor and regulate the output current to the defined threshold.

In accordance with a second aspect the output current is limited to a maximum of 20 mA.

In accordance with a third aspect the output current is limited to a minimum of 4 mA.

In accordance with a further aspect the output current is configured by component values to be limited between a range from 4 to 20 mA In accordance with a further aspect incorrect information due to microcontroller dysfunction cannot be sent to a customer controller.

In accordance with a further aspect the combination of R1 & R2 determines a gain of amplification.

In accordance with a further aspect if a final output current through R2 exceeds the defined threshold, then a dropout voltage in R3 biases Q1.

In accordance with a further aspect when Q1 starts to conduct current when biased by the dropout voltage in R3, then the current through Q2 base is reduced and output current is limited between the configured range as determined by the component values.

According to a second aspect, an exemplary embodiment relates to A system for sensing bearing shaft rotation over 360 mechanical degrees, the system comprising: a magnetic field, a bearing rotating a magnetic impulse ring, a sensor for picking up the signals generated by the rotation of the magnetic impulse ring through the magnetic field, an analog output current transmitter in communication with the sensor including; a first circuit portion that generates analog sine and cosine voltage signals from the sensed signals, a second circuit portion that transforms the analog sine and cosine voltage signals into current signals, the transformed current signals being transformed by an operational transconductance amplifier, a third circuit portion providing a current limiter, the current limiter circuitry limits the output current to a defined threshold, wherein no microcontroller is required in order to monitor and regulate the output current to the defined threshold.

In a final aspect, a method for sensing bearing shaft rotation over 360 mechanical degrees, the method comprising: an impulse ring providing a magnetic field, a bearing rotating the impulse ring, a sensor for picking up the signals generated by the rotation of the magnetic field, and an analog output current transmitter in communication with the sensor, generating analog sine and cosine voltage signals from the sensed signals in a first circuit portion, transforming the analog sine and cosine voltage signals into current signals, the transformed current signals being transformed by an operational transconductance amplifier in a second circuit portion, limiting the output current signals to a defined threshold with a third circuit portion, the third circuit portion providing a current limiter, wherein no microcontroller is required in order to monitor and regulate the output current to the defined threshold.

BRIEF DESCRIPTION OF THE DRAWINGS

The invention will now be described, by way of example, with reference to the accompanying drawings, in which.

DETAILED DESCRIPTION OF THE VARIOUS EMBODIMENTS

Figure 1:
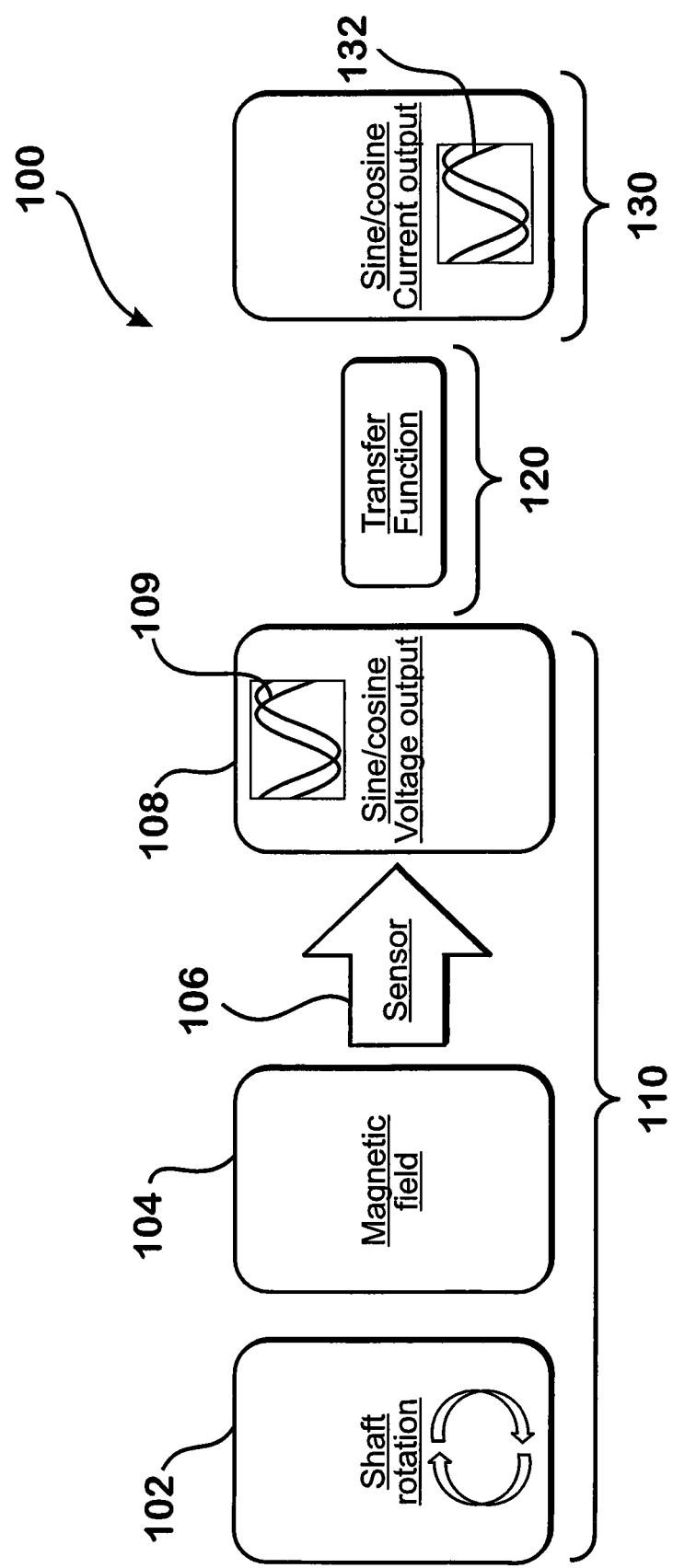
FIG. 1 depicts a schematic diagram of a system for sensing bearing shaft rotation over 360 mechanical degrees in accordance with one or more embodiments.

The following detailed description refers to the accompanying drawings.

Wherever possible, the same reference numbers are used in the drawings and the following description refers to the same or similar parts. While several exemplary embodiments and features of the present disclosure are described herein, modifications, adaptations, and other implementations are possible, without departing from the spirit and scope of the present disclosure. Accordingly, the following detailed description does not limit the present disclosure. Instead, the proper scope of the disclosure is defined by the appended claims.

System

Figure 1A:
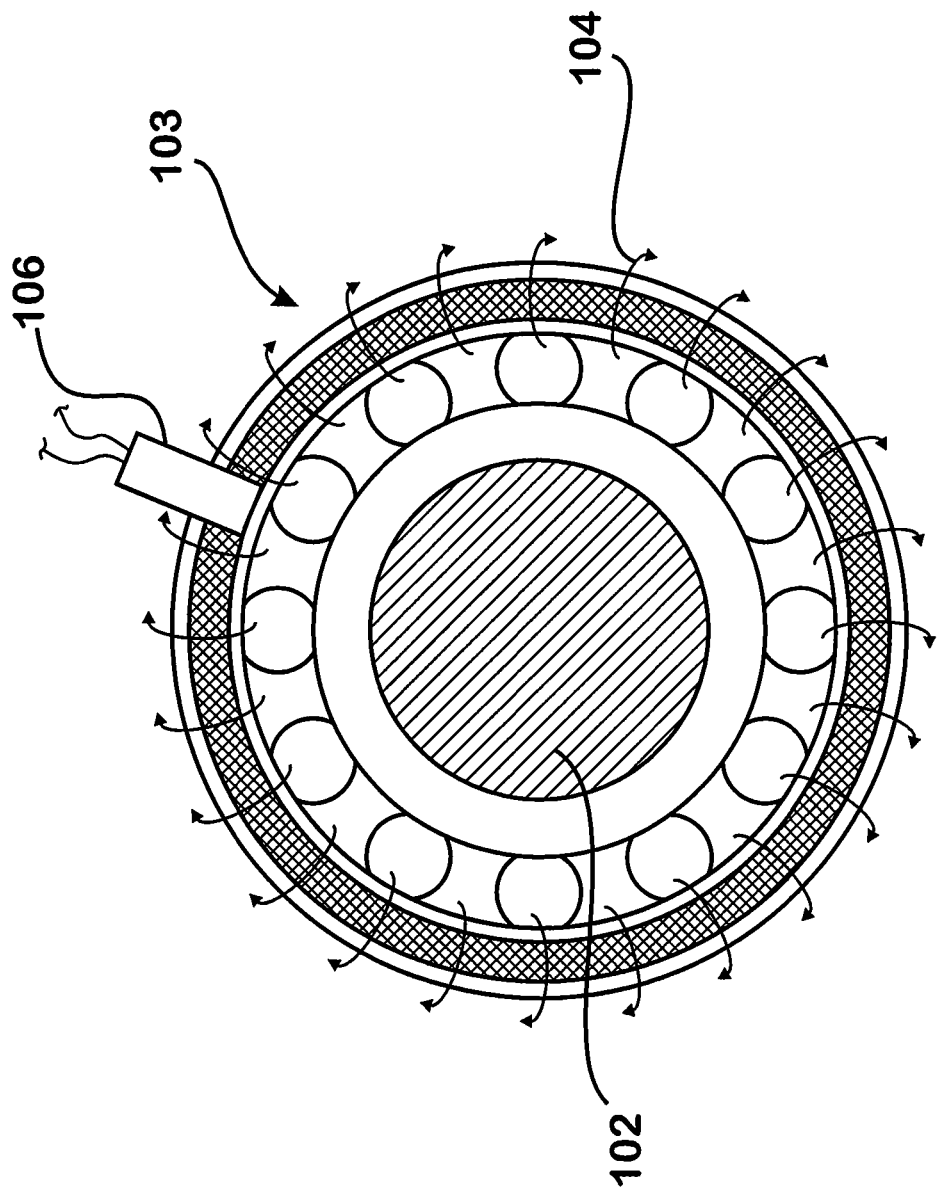
FIG. 1A depicts a system in which a bearing is positioned on a shaft. The bearing includes a magnetic impulse ring which rotates with the bearing to generate a magnetic field and includes a sensor for picking up the signals generated by the rotation of the magnetic impulse ring.

FIGS. 1 and 1A depict a system 100 having an analog output current transmitter for sensing bearing shaft rotation over 360 mechanical degrees. The system 100 provides a bearing 102 rotating an impulse ring 103 that creates a dynamic magnetic field 104. A sensor 106 picks up the signals generated by the rotation of the magnetic field 104 through the bearing. The sensor 106 generates outputs 108 in the form of sine and cosine voltage wave signals 109.

A first circuit portion 110 generates analog sine and cosine voltage signals. A second circuit portion 120 transforms the analog sine and cosine voltage signals into current signals. The signals are transformed by an operational transconductance amplifier. A third circuit portion 130 provides a current limiter circuit. The current limiter circuitry 130 limits the output current to a defined threshold. As such, no microcontroller is required in order to monitor and regulate the output current to the defined threshold.

The principle of the system 100 is to retrieve the analog voltage wave signals 109 first in circuit portion 110, then a transconductance amplifier transforms the voltage into current in circuit portion (120). Once the current is obtained in circuit portion (120) some drift is possible with the influence of temperature or offset fluctuation. To tackle this issue, a current limiter or circuit portion (130) is added that constrains the output current waveform (132) to a maximum 20 mA. A minimum current output waveform may provide 4 mA in the constructs of the present inventive configuration.

The minimum and maximum current design constraints are typically determined by a customer. As such, the individual electronic components may be selected in order to satisfy the customers' needs with respect to their desired current output levels.

Figure 2:
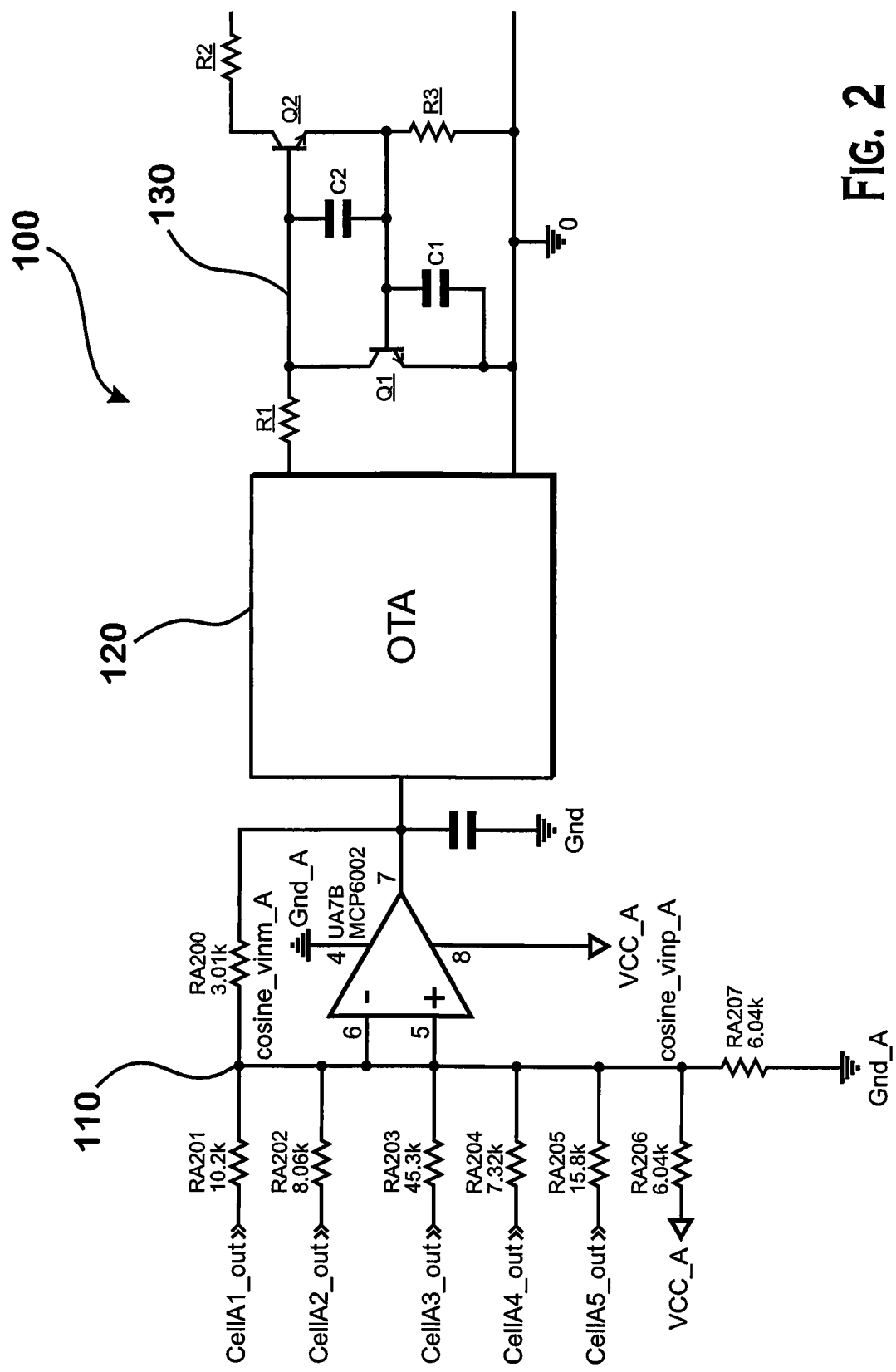
FIG. 2 depicts a circuit diagram of an analog output current transmitter for sensing bearing shaft rotation over 360 mechanical degrees in accordance with one or more embodiments in accordance with one or more embodiments.

Analog Sine and Cosine Voltage Signals:

FIG. 2 shows a schematic view of the circuit 110 for sensing shaft rotation of a bearing over 360 mechanical degrees.

Analog sine and cosine voltage signals are generated here in the circuit 110. An analog system is a system of proportion. One can see it as values of percentages. Analog systems are used where proportional voltages or current levels are required. The signals have no discrete steps, they are of an infinite variability in nature. Analogue electronics are in contrast to digital electronics where signals usually take only two levels.

Transconductance of Voltage Signals

Operational transconductance amplifier (OTA) 120 transforms the voltage signals into current signals. An operational transconductance amplifier is one that converts a voltage to a current. An OTA marries the terms transconductance amplifier and operational amplifier.

Current Limiting Circuit

The current limiter architecture 130 limits the output current below a defined threshold. This is because the output current can deviate due to temperature shift. In one embodiment, the current output delivers 4 to 20 mA current output over 360 mechanical degrees.

Here, the current through R1 triggers Q2, the combination of R1 & R2 determines the gain of the amplification. If the final current through R2 exceeds the defined threshold, then a dropout voltage in R3 biases Q1. When Q1 is biased, it starts to conduct some current. This causes the current through Q2 base to be reduced and thus the output current is limited.

The key point is to select Q2 and Q1 with a known amplification gain. R1 and R2 will be selected to have the ratio R2/R1 and IC/IB on Q2 equals to the chosen gain. As the output is an open collector, Ic also depends on the pull up voltage desired by the customer, (Ic=Vpull up/R2). So, when Ic>20 mA (on Q2), the voltage across R2 will turn on Q1, and the base current of Q2 will be split in two to decrease Ic.

EXAMPLE

Let's consider the output after OTA (1) is 40_200 µA, Q2 is selected to have a gain of 100 so R1/R2=100, and Ic (on Q2) equals 20 mA maximum. If customer pull up voltage is 5V then R2=5/20 mA=250 ohms. So R1=25 kohms, R2=250 ohms Q1 and Q2 gain equals 100. When more than 20 mA will be driven by the customer, then the regulation through Q1 will trigger and limit the output current to 20 mA.

The benefit of such system is to avoid any monitoring of the current with a microcontroller. So, less validation from customer side is required. In addition, no software validation is required. Furthermore, there's no error state, the sensor is either functional or broken. As such, no wrong information due to microcontroller disfunction can be sent to the customer controller. This significantly reduces the failure rate of the system.

Method

Figure 3:
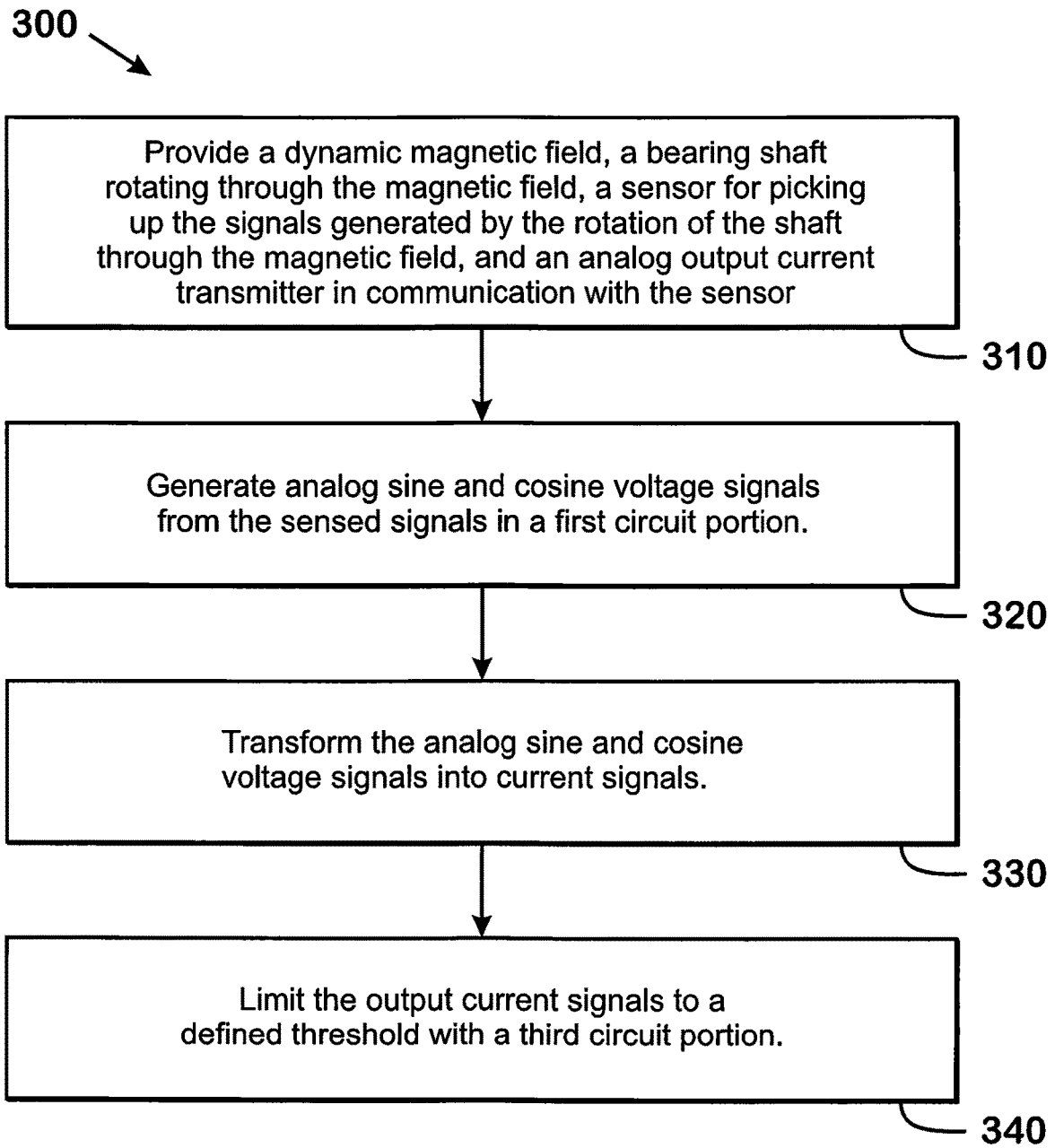
FIG. 3 depicts a flow diagram of a method for sensing bearing shaft rotation over 360 mechanical degrees in accordance with one or more embodiments.

A method 300 for sensing bearing shaft rotation over 360 mechanical degrees is illustrated in FIG. 3.

The method includes a step 310 of providing a dynamic magnetic field, a bearing shaft rotating through the magnetic field, a sensor for picking up the signals generated by the rotation of the shaft through the magnetic field, and an analog output current transmitter in communication with the sensor.

The method further includes step 320 of generating analog sine and cosine voltage signals from the sensed signals in a first circuit portion and step 330 transforming the analog sine and cosine voltage signals into current signals. Here the transformed current signals are transformed by an operational transconductance amplifier in the second circuit portion.

In a final step 340 the method provides limiting the output current signals to a defined threshold with a third circuit portion. Here, the third circuit portion providing a current limiter. As such, no microcontroller is required in order to monitor and regulate the output current to the defined threshold.

Since many modifications, variations, and changes in detail can be made to the described preferred embodiments and methods of the invention, it is intended that all matters in the foregoing description and shown in the accompanying drawings be interpreted as illustrative and not in a limiting sense. Thus, the scope of the invention should be determined by the appended claims and their legal equivalence.

The invention claimed is:

1. An analog output current transmitter comprising;
a first circuit portion that generates analog sine and cosine voltage signals,
a second circuit portion that transforms the analog sine and cosine voltage signals into current signals, the signals being transformed by an operational transconductance amplifier,
a third circuit portion providing a current limiter, the current limiter circuitry limits the output current to a defined threshold, the third circuit portion comprising a first resistor R1 and a second resistor R2, the third circuit further comprising a third resistor R3 and a transistor Q1, wherein no microcontroller is required in order to monitor and regulate the output current to the defined threshold, wherein the output current is configured by component values to be limited between a range from 4 to 20 mA, the combination of the first resistor R1 and the second resistor R2 determines a gain of amplification, wherein if a final output current through the second resistor R2 exceeds the defined threshold, then a dropout voltage in the third resistor R3 biases the transistor Q1.

2. The analog output current transmitter of claim 1, wherein the output current is limited to a maximum of 20 mA.

3. The analog output current transmitter of claim 1, wherein the output current is limited to a minimum of 4 mA.

4. The analog output current transmitter of claim 1, wherein incorrect information due to microcontroller dysfunction cannot be sent to a customer controller.

5. The analog output current transmitter of claim 1, wherein when the transistor Q1 starts to conduct current when biased by the dropout voltage in the third resistor R3, then the current through a second transistor Q2 base is reduced and output current is limited between the configured range as determined by the component values.

6. A system for sensing bearing shaft rotation over 360 mechanical degrees, the system comprising:
   a magnetic field,
   a bearing rotating a magnetic impulse ring to generate the magnetic field,
   a sensor for picking up the signals generated by the rotation of the magnetic impulse ring through the magnetic field,
   an analog output current transmitter in communication with the sensor including;
   a first circuit portion that generates analog sin and cosine voltage signals from the sensed signals,
   a second circuit portion that transforms the analog sine and cosine voltage signals into current signals, the transformed current signals being transformed by an operational transconductance amplifier,
   a third circuit portion providing a current limiter, the current limiter circuitry limits the output current to a defined threshold, wherein
   no microcontroller is required in order to monitor and regulate the output current to the defined threshold.

7. The system of claim 6, wherein the output current is configured by component values to be limited between a range from 4 to 20 mA.

8. The system of claim 7, the third circuit portion comprising a first resistor R1 and a second resistor R2, wherein the combination of the first resistor R1 and the second resistor R2 determines a gain of amplification.

9. The system of claim 8, the third circuit portion comprising a third resistor R3 and a first transistor Q1, wherein if a final output current through the second resistor R2 exceeds the defined threshold, then a dropout voltage in a third resistor R3 biases the transistor Q1.

10. The system of claim 9, the third circuit portion comprising a second transistor Q2, wherein when the transistor Q1 starts to conduct current when biased by the dropout voltage in the third resistor R3, then the current through the second transistor Q2 base is reduced and output current is limited between the configured range as determined by the component values.

11. A method for sensing bearing shaft rotation over 360 mechanical degrees, the method comprising:
   providing an impulse ring providing a magnetic field, a bearing rotating the impulse ring, a sensor for picking up the signals generated by the rotation of the magnetic field, and an analog output current transmitter in communication with the sensor,
   generating analog sine and cosine voltage signals from the sensed signals in a first circuit portion,
   transforming the analog sine and cosine voltage signals into current signals, the transformed current signals being transformed by an operational transconductance amplifier in a second circuit portion,
   limiting the output current signals to a defined threshold with a third circuit portion, the third circuit portion providing a current limiter, wherein
   no microcontroller is required in order to monitor and regulate the output current to the defined threshold.

12. The method of claim 11, wherein the step of limiting the output current signals further comprises the output current being limited between a range from 4 to 20 mA.

13. The method of claim 12, wherein the step of limiting the output current further comprises the third circuit portion using the combination of a first resistor R1 and a second resistor R2 to determine a gain of amplification.

14. The method of claim 13, wherein the step of limiting the output current further comprises the third circuit portion determining whether a final output current through the second resistor R2 exceeds the defined threshold and, if so, then a dropout voltage in a third resistor R3 of the third circuit portion biases a transistor Q1.

* * * * *